United States Patent
Liu et al.

(10) Patent No.: US 10,598,220 B2
(45) Date of Patent: Mar. 24, 2020

(54) BEARING DEVICE AND ION IMPLANTATION DEVICE

(71) Applicants: BOE TECHNOLOGY GROUP CO., LTD., Beijing (CN); CHENGDU BOE OPTOELECTRONICS TECHNOLOGY CO., LTD., Sichuan Province (CN)

(72) Inventors: Chenliang Liu, Beijing (CN); Donghua Jiang, Beijing (CN); Yongyi Fu, Beijing (CN); Chao Tan, Beijing (CN); Xuewei Wang, Beijing (CN); Rujian Li, Beijing (CN); Kang Luo, Beijing (CN); Yongzhou Ling, Beijing (CN); Yin Xie, Beijing (CN); Jianbo Yang, Beijing (CN); Fei Li, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 211 days.

(21) Appl. No.: 15/816,341

(22) Filed: Nov. 17, 2017

(65) Prior Publication Data
US 2018/0258988 A1    Sep. 13, 2018

(30) Foreign Application Priority Data

Mar. 9, 2017   (CN) ............................ 2017 1 0137906

(51) Int. Cl.
*F16C 29/06*   (2006.01)
*F16M 11/04*   (2006.01)
(Continued)

(52) U.S. Cl.
CPC ............ *F16C 29/06* (2013.01); *F16M 11/043* (2013.01); *H01J 37/20* (2013.01); *G03F 7/70716* (2013.01); *H01J 2237/20221* (2013.01)

(58) Field of Classification Search
CPC ........ F16C 29/06; F16M 11/043; H01J 37/20; H01J 2237/20221; H01L 21/687; G03F 7/70716
See application file for complete search history.

(56) References Cited

U.S. PATENT DOCUMENTS 5,694,214 A * 12/1997 Watanabe .......... G01N 21/8851
356/124
6,102,096 A *  8/2000 Johansson ............. B32B 38/185
156/353

(Continued)

FOREIGN PATENT DOCUMENTS

CN    101040059 A    9/2007
CN    101807538 A    8/2010
(Continued)

OTHER PUBLICATIONS

First Office Action for Chinese Application No. 201710137906.1, dated Feb. 14, 2018, 6 Pages.

*Primary Examiner* — Tan Le
(74) *Attorney, Agent, or Firm* — Brooks Kushman P.C.

(57) ABSTRACT

A bearing device and an ion implantation device are provided. The bearing device includes a bearing table configured to bear a substrate, and a plurality of supporting components configured to support the substrate, each supporting component is movably arranged on the bearing table, to support the substrate at an adjustable position.

13 Claims, 3 Drawing Sheets

(51) Int. Cl.
*H01J 37/20* (2006.01)
*H01L 21/68* (2006.01)
*G03F 7/20* (2006.01)

(56) References Cited

U.S. PATENT DOCUMENTS

| | | | | |
|---|---|---|---|---|
| 6,498,642 | B1* | 12/2002 | Duckett | G01M 11/00 |
| | | | | 356/124 |
| 2006/0033043 | A1* | 2/2006 | Arai | G03F 7/70716 |
| | | | | 250/492.2 |
| 2006/0075969 | A1 | 4/2006 | Fischer | |
| 2008/0056857 | A1* | 3/2008 | Hiroki | H01L 21/681 |
| | | | | 414/217.1 |
| 2018/0067397 | A1* | 3/2018 | Aoki | G03F 7/201 |

FOREIGN PATENT DOCUMENTS

| | | |
|---|---|---|
| CN | 103399425 A | 11/2013 |
| CN | 105824200 A | 8/2016 |
| CN | 106098601 A | 11/2016 |
| EP | 0299800 * | 1/1989 |

\* cited by examiner

BEARING DEVICE AND ION IMPLANTATION DEVICE

CROSS-REFERENCE TO RELATED APPLICATION

This application claims priority to Chinese Patent Application No. 201710137906.1 filed on Mar. 9, 2017, which is incorporated herein by reference in its entirety.

TECHNICAL FIELD

The present disclosure relates to a device for manufacturing or processing a solid device, and in particular to a bearing device and an ion implantation device.

BACKGROUND

The ion implantation technology is a material surface modification technology which is developed and applied internationally in the last 30 years. The principle of the ion implantation includes: an ion beam with an energy magnitude of 100 keV is emitted to a material, atoms or molecules of the ion beam and the material may be subjected to a series of physical and chemical reaction, and then the emitted ions may lose their energy gradually and finally remain in the material. Therefore, an ingredient, a structure and a performance of a surface of the material may be changed, thereby optimizing the performance of the material surface or obtain new and good performance thereof.

During the ion implantation, firstly a glass substrate may be arranged horizontally on a platen of a substrate bearing device, and then the glass substrate may be switched to a vertical posture by the platen and scanned. During this process, pins of the platen may be in contact with a back of the substrate. In the related art, a top portion of each pin is ball-like and a contact area with the substrate is small, and the pins are fixed onto the platen, since a surface of the pin may be abraded as a service time thereof increases, static charges may occur when rotating the platen. In particular, when the supporting position of the pin is at an effective display region (i.e., A/A region) of the display panel, the thin film transistor may be adversely affected by the static charges discharged on the back of the glass substrate. As a result, bright-dark spots and white Mura may occur.

SUMMARY

The objective of the present disclosure is to provide a bearing device and an ion implantation device, so as to reduce an occurrence of bright-dark spots and white Mura caused when supporting components are in contact with a substrate.

A bearing device is provided in some embodiments of the present disclosure, including: a bearing table configured to bear a substrate, and a plurality of supporting components configured to support the substrate, where each supporting component is movably arranged on the bearing table, to support the substrate at an adjustable position.

Optionally, a guide rail is arranged on the bearing table, and a plurality of sliding blocks capable of moving along the guide rail is arranged on the guide rail, where each sliding block is provided with at least one supporting component.

Optionally, the guide rail is a bar-like protrusion protruding from a side surface of the bearing table, a groove is arranged in a middle of each sliding block and opened towards the guide rail, and the guide rail is embedded into the sliding block.

Optionally, a plurality of balls is arranged between an inner wall of the groove and a surface of the guide rail and arranged in at least one line in a direction identical to an extension direction of the guide rail.

Optionally, each sliding block includes a first portion forming a bottom of the groove and a second portion and a third portion forming two side walls of the groove respectively, where both the second portion and the third portion are detachably connected to the first portion, and the balls are arranged on a surface of the second portion opposite to the guide rail and a surface of the third portion opposite to the guide rail.

Optionally, a cross section of the groove is of a trapezoidal shape with a size of a bottom of the groove larger than a size of the opening of the groove, and the guide rail is fitted to the groove and has a trapezoidal cross section.

Optionally, the bearing table has a first side edge, a second side edge opposite to the first side edge, a third side edge and a fourth side edge opposite to the third side edge, a rollover shaft is arranged at the first side edge and configured to enable the bearing table to be switched from a horizontal posture to a vertical posture, and the guide rail is arranged along an extension direction of the third side edge and the fourth side edge.

Optionally, the bearing device further includes a driving mechanism configured to drive the sliding blocks to move along the guide rail, where the driving mechanism includes: cross bars, where the supporting components are arranged in an array form, and the sliding blocks corresponding to the supporting components in an identical row are connected to an identical cross bar, to enable the supporting components in the identical row to move simultaneously; a driving rail arranged at at least one of the third side edge and the fourth side edge of the bearing table, where an end of each cross bar is arranged on the driving rail and the cross bar is capable of moving along the driving rail; and driving members configured to drive the cross bars to move along the driving rail in a reciprocating manner.

Optionally, each driving member includes: a driving motor including an output shaft; and a rotatable gear capable of rotating when driven by the output shaft, where an end of the cross bar is connected to a center of the rotatable gear, and the rotatable gear is capable of rotating relative to the cross bar; the driving rail has a rack engaged with the rotatable gear.

Optionally, a cross section of the bearing table is of a stepwise structure, and a thickness of the bearing table decreases gradually from the first side edge of the bearing table to the second side edge of the bearing table.

Optionally, each supporting component includes a contact end in contact with the substrate and a connection end at a side of the supporting component far away from the contact end, where an end surface of the contact end of the supporting component is a plane having a predetermined area.

Optionally, each supporting component is of a cylindrical structure, and an edge of the contact end is of a chamfered structure acquired through smoothing treatment.

Optionally, an extension direction of each cross bar is perpendicular to an extension direction of the drive rail.

Optionally, an extension direction of each cross bar is perpendicular to an extension direction of the bearing table.

An ion implantation device is further provided in some embodiments of the present disclosure, including the above bearing device.

DETAILED DESCRIPTION

The present disclosure will be described hereinafter in conjunction with the drawings. The following embodiments are for illustrative purposes only, but shall not be used to limit the scope of the present disclosure.

In the related art, when supporting components of a substrate bearing device is in contact with a liquid crystal screen, a static problem may be developed there between, which may result in an adverse effect to the device. In view of this, the present disclosure provides a bearing device, so as to reduce an occurrence of bright-dark spots and white Mura caused when the supporting components are in contact with the substrate.

Figure 1:
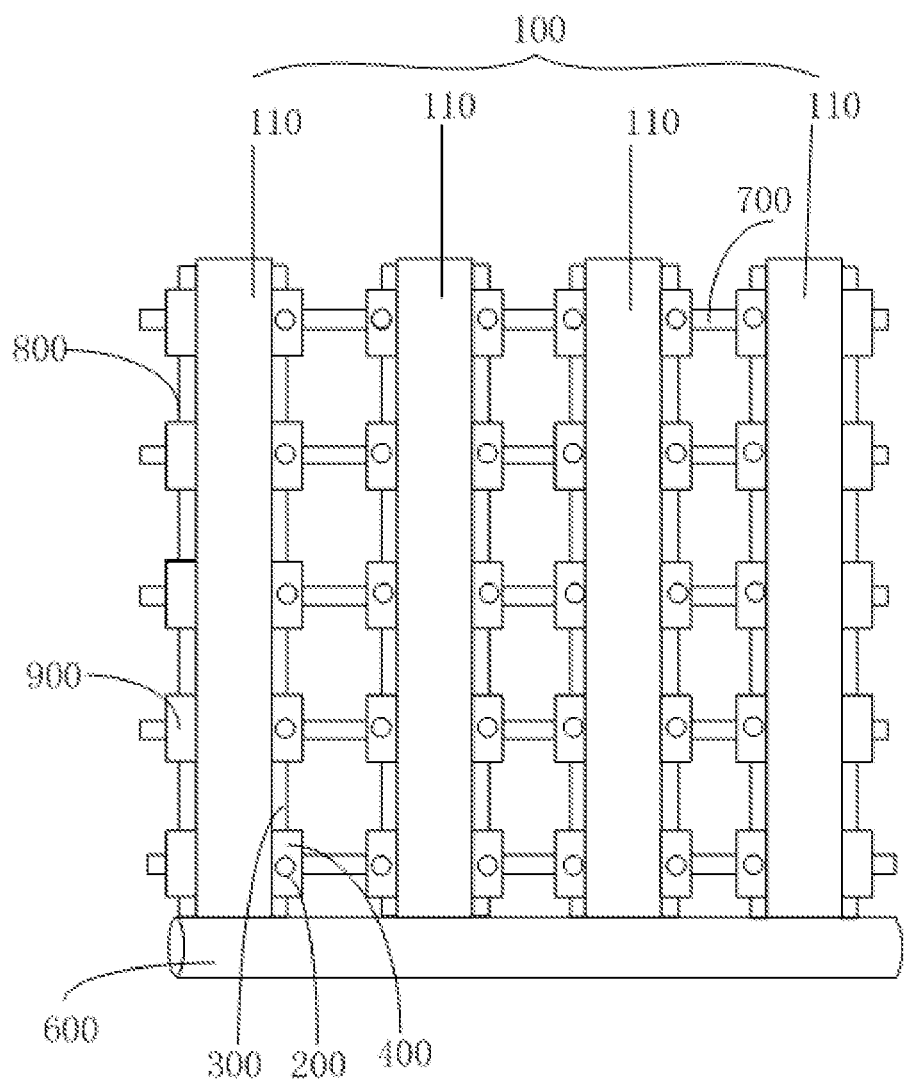
FIG. 1 is a schematic view of a bearing device in some embodiments of the present disclosure.

As shown in FIG. 1, a bearing device is provided in some embodiments of the present disclosure, including: a bearing table 100 configured to bear a substrate, and a plurality of supporting components 200 configured to support the substrate, each supporting component 200 is movably arranged on the bearing table 100, so as to support the substrate at an adjustable position.

According to the bearing device in at least one embodiment of the present disclosure, the supporting components 200 arranged on the bearing table 100 are movable, so as to adjust the supporting position of each supporting component 200 on the substrate according to different types of substrate and avoid predetermined regions of the substrate. For example, the supporting components 200 are arranged to avoid an effective display region (A/A region) of the liquid crystal screen, so as to protect a thin film transistor of the liquid crystal screen from static charges generated between the supporting components 200 and the substrate, thereby reducing an occurrence of defections.

Figure 2:
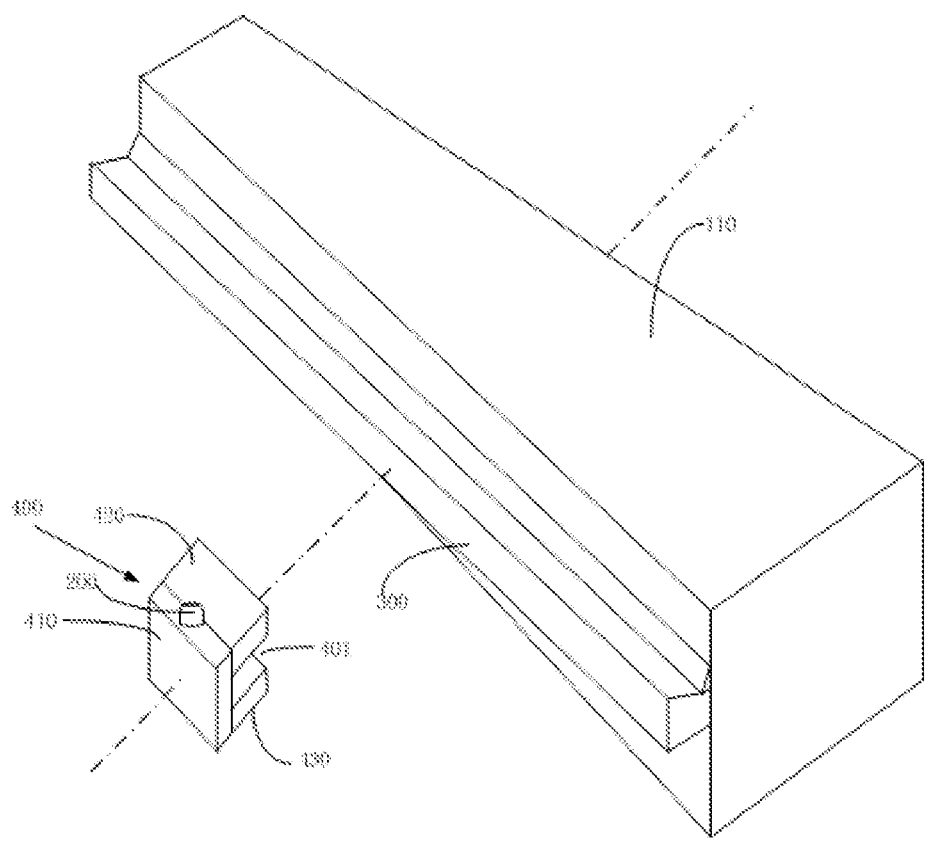
FIG. 2 is a schematic view of a guide rail and a sliding block of a bearing device in some embodiments of the present disclosure.

As shown in FIG. 1 and FIG. 2, in some embodiments of the present disclosure, a guide rail 300 is arranged on the bearing table 100, a plurality of sliding blocks 400 capable of moving along the guide rail 300 is arranged on the guide rail 300, and each sliding block 400 is provided with at least one supporting component 200.

According to the above arrangement, the guide rail 300 is arranged on the bearing table 100 and the movable sliding blocks 400 are arranged on the guide rail 300, the supporting components 200 are connected to the sliding blocks 400, and then the supporting components 200 can be moved when moving the sliding blocks 400 along the guide rail 300. The supporting components 200 can be moved through a cooperation of the sliding blocks 400 and the guide rail 300, so the structure of the device is simple and the operation thereof is easy.

It should appreciated that, in actual use, the way how the supporting components 200 are moved on the bearing table 100 is not limited herein, and the detailed description thereof is omitted herein.

In the following embodiments, a cooperation of the sliding blocks 400 and the guide rail 300 is provided.

Figure 3:
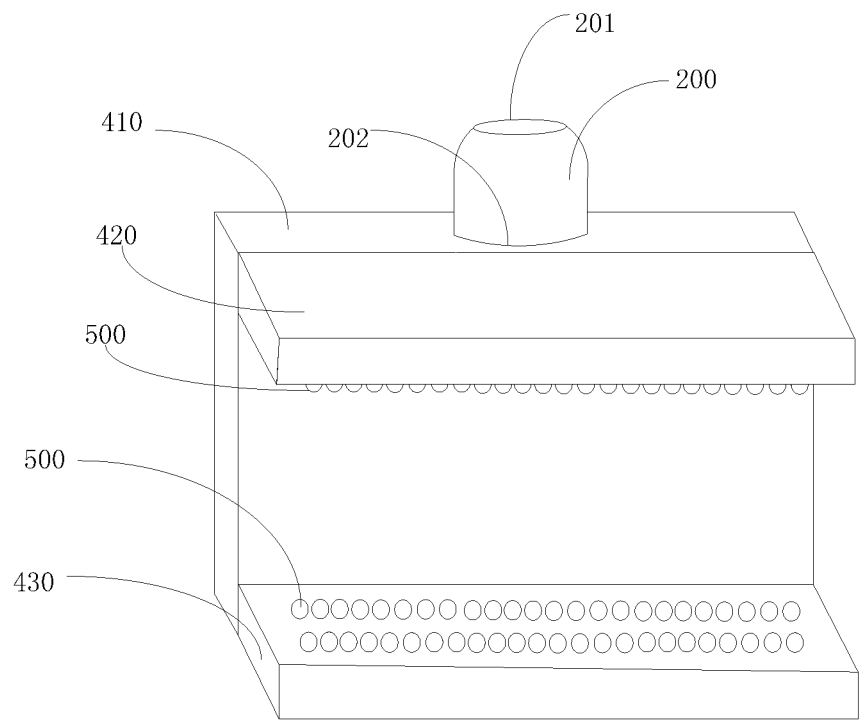
FIG. 3 is a schematic view of a supporting component and a sliding block of a bearing device in some embodiments of the present disclosure.

As shown in FIG. 2 and FIG. 3, the guide rail 300 is a bar-like protrusion protruding from a side surface of the bearing table 100, a groove 401 is arranged in a middle of each sliding block 400 and opened towards the guide rail 300, and the guide rail 300 is embedded into the sliding block 400.

According to the above arrangement, the guide rail 300, which is designed as a bar-like protrusion, may be arranged on the side surface of the bearing table 100, the groove 401 is arranged in the middle of each sliding block 400, and the guide rail 300 is embedded into the semi-monocoque sliding block 400, therefore such arrangement is simple. It should be appreciated that, a cooperation of the sliding blocks 400 and the guide rail 300 is not limited herein.

Optionally, as shown in FIG. 3, a plurality of balls 500 is arranged between an inner wall of the groove 401 of the sliding block 400 and a peripheral surface of the guide rail 300 and arranged in at least one line in a direction identical to an extension direction of the guide rail 300.

According to the above arrangement, the balls 500 are arranged between the sliding block 400 and the guide rail 300, so the sliding block 400 may be moved on the guide rail 300 smoothly.

Optionally, as shown in FIG. 2 and FIG. 3, the balls 500 are arranged between an upper side surface of the guide rail 300 and a side wall of the groove 401 of the sliding block 400 and between a lower side surface of the guide rail 300 and the other side wall of the groove 401 of the sliding block 400. Optionally, two lines of balls 500 are arranged between each inner wall of the groove 401 and the side surfaces of the guide rail 300, such that the sliding block 400 may be moved more smoothly.

It should be appreciated that, the arrangement of the balls 500 between the guide rail 300 and the sliding block 400 is not limited herein, which may be adjusted as needed.

Optionally, as shown in FIG. 2 and FIG. 3, each sliding block 400 includes a first portion 410 forming a bottom of the groove 401 and a second portion 420 and a third portion 430 forming two side walls of the groove 401 respectively, both the second portion 420 and the third portion 430 are detachably connected to the first portion 410, and the balls 500 are arranged on the second portion 420 and the third portion 430, so as to form a protective shell for the balls 500.

According to the above arrangement, the second portion 420 and the third portion 430 on which the balls 500 are arranged are detachably connected to the first portion 410, which are easy to be detached and replaced. When the balls 500 are out of work, it is able to detach the second portion and the third portion to replace the balls 500.

In some embodiments of the present disclosure, as shown in FIG. 2, a cross section of the groove 401 is of a trapezoidal shape with a size of a bottom of the groove larger than a size of the opening of the groove, and the guide rail 300 is fitted to the groove 401 and has a trapezoidal cross section.

According to the above arrangement, the guide rail 300 has trapezoidal cross section and is fitted to the groove 401 of the sliding block 400, so as to prevent the sliding block 400 from falling off from the guide rail 300.

In some embodiments of the present disclosure, as shown in FIG. 1, the bearing table 100 has a first side edge, a second side edge opposite to the first side edge, a third side edge and a fourth side edge opposite to the third side edge, a rollover shaft 600 is arranged at the first side edge and configured to enable the bearing table 100 to be switched from an horizontal posture to a vertical posture, and the guide rail 300 is arranged along an extension direction of the third side edge and the fourth side edge of the bearing table 100.

According to the above arrangement, the rollover shaft 600 is arranged at the first side edge, it is able to switch the substrate carried by the bearing table 100 from a horizontal posture to a vertical posture. The guide rail 300 is arranged along the extension direction of the third side edge and the fourth side edge, so the supporting components 200 may be moved along the extension direction of the third side edge and the fourth side edge.

In some embodiments of the present disclosure, as shown in FIG. 1, the bearing table 100 includes a plurality of supporting portions 110, the guide rail 300 is arranged at the side surface of each supporting portion 110, and a plurality of sliding blocks 400 is arranged on each guide rail 300.

The bearing device further includes a driving mechanism configured to drive the sliding blocks 400 to move along the guide rail. The driving mechanism includes: cross bars 700, where the supporting components 200 are arranged in an array form, and the sliding blocks 400 corresponding to the supporting components 200 in an identical row are connected to an identical cross bar 700, to enable the supporting components 200 in the identical row to move simultaneously; a driving rail 800 arranged at at least one of the third side edge and the fourth side edge of the bearing table 100 (i.e., an outer surface of the outmost supporting portion 110), where an end of each cross bar 700 is arranged on the driving rail 800 and the cross bar 700 is capable of moving along the driving rail 800; and driving members configured to drive the cross bars 700 to move along the driving rail 800 in a reciprocating manner.

According to the above arrangement, the sliding blocks 400 corresponding to the supporting components 200 in an identical row are connected to an identical cross bar 700 which may drive the sliding blocks 400 move along the guide rail 300, thereby moving the supporting components 200 in the row to move synchronously along the extension direction of the guide rail 300, so it is able to adjust the positions of the supporting components 200 according to different types of substrate. Such structure is simple and the operation is easy because it is able to move the supporting components 200 in an identical row synchronously.

In some embodiments of the present disclosure, each driving member includes: a driving motor (not shown in FIG. 1) including an output shaft; and a rotatable gear 900 capable of rotating when driven by the output shaft, where an end of the cross bar 700 is connected to a center of the rotatable gear 900, and the rotatable gear 900 is capable of rotating relative to the cross bar 700. The driving rail 800 has a rack engaged with the rotatable gear 900.

According to the above arrangement, the driving motor drives the rotatable gear 900 to rotate, and because the driving rail 800 has the rack engaged with the rotatable gear 900, it is able to drive the cross bar 700 to move along the extension direction of the driving rail 800 in a reciprocating manner when rotating the rotatable gear 900 so as to drive sliding blocks connected to the cross bar 700 to move in a reciprocating manner, thereby moving the supporting components 200 in an identical row synchronously.

It should be appreciated that, in some embodiments of the present disclosure, the arrangement and connection relationship of the supporting components 200, the sliding blocks 400 and the guide rail 300 are not limited herein. For example, the supporting components 200 may be move independently, and in compared with the above arrangement where the supporting components 200 in an identical row are moved synchronously, it is able to optimize the movement range of the supporting components 200 and move the supporting components 200 independently as needed. However, it may be difficult to control the supporting components 200 and difficult to implement.

Figure 4:
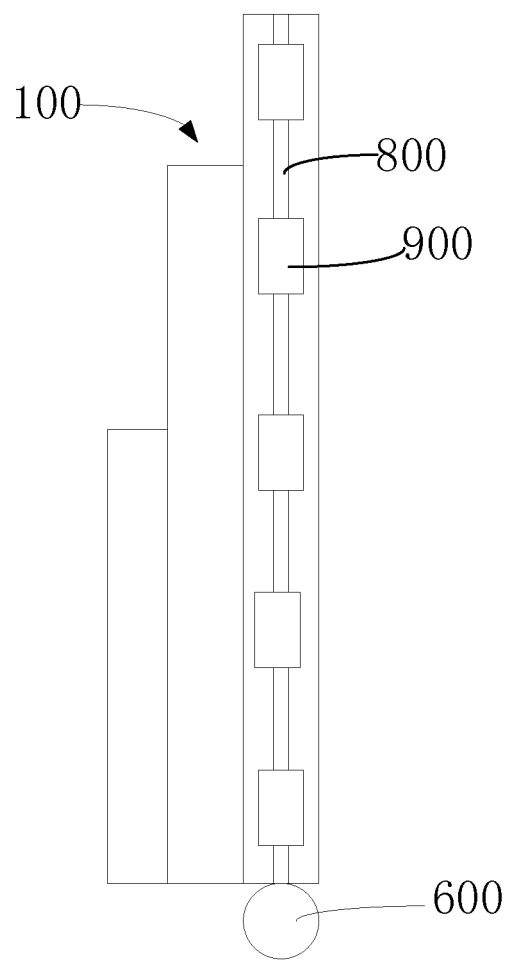
FIG. 4 is a side view of a bearing table of a bearing device in some embodiments of the present disclosure.

In some embodiments of the present disclosure, as shown in FIG. 4, a thickness of the bearing table 100 decreases gradually from the first side edge of the bearing table to the second side edge of the bearing table 100.

According to the above arrangement, a cross section of the bearing table 100 is of a stepwise structure. As such, a distance between a center of gravity of the bearing table 100 and the rollover shaft 600 may be reduced, and the center of gravity of the bearing table 100 may be closer to the rollover shaft 600, therefore it is conducive to keep a mechanical motion stability of the bearing table 100 when rotating the bearing table 100.

In some embodiments of the present disclosure, as shown in FIG. 4, the cross section of the bearing table 100 is of a stepwise structure, so the thickness of the bearing table 100 decreases gradually from the first side edge of the bearing table 100 to the second side edge of the bearing table 100.

It should be noted that, according to the above arrangement, the cross section of the bearing table 100 is designed to be a stepwise structure, so as to reduce the distance between the center of gravity of the bearing table 100 and the rollover shaft 600, therefore the thickness of the bearing table 100 may be changed smoothly and the manufacture of the bearing table 100 may be easy. It should be appreciated that, in actual use, the structure of the bearing table 100 is not limited herein, as long as the thickness of the bearing table 100 may decrease gradually from the first side edge of the bearing table 100 to the second side edge of the bearing table 100.

In addition, in the related art, since a surface of the supporting component 200 of the bearing table 100 may be abrade as a service life thereof increases, static charges may occur on the supporting component 200 when rotating the bearing table 100. In addition, a top portion of the supporting component 200 is ball-like and a contact area with a back of the substrate is small, the static charges may be accumulated and then discharged suddenly. As a result, the bright-dark spots and the white Mura may occur on the OLED display substrate.

As shown in FIG. 3, in some embodiments of the present disclosure, each supporting component 200 includes a contact end 201 in contact with the substrate and a connection end 202 at a side of the supporting component 200 far away from the contact end 201, and an end surface of the contact end 201 of the supporting component 200 is a plane having a predetermined area.

According to the above arrangement, the structure of the supporting component 200 is improved in compared with the related art. That is, the ball-like top portion of the supporting component 200 is replaced by a plane contact end surface, thereby increasing the contact area with the substrate and restraining the discharge of the static charges.

In some embodiments of the present disclosure, as shown in FIG. 4, each supporting component 200 is of a cylindrical structure, and an edge of the contact end 201 is of a chamfered structure acquired through smoothing treatment.

According to the above arrangement, the movable supporting component 200 is designed to be of a cylindrical structure and the edge of the top portion thereof is smoothed, so as to protect the substrate from being scratched when placing the substrate.

In addition, an ion implantation device is further provided in some embodiments of the present disclosure, including the bearing device in some embodiments of the present disclosure.

According to the ion implantation device in at least one embodiment of the present disclosure, the supporting components arranged on the bearing table are movable, so as to adjust the supporting position of each supporting component on the substrate according to different types of substrate and avoid predetermined regions of the substrate. For example, the supporting components may be arranged to avoid an effective display region (A/A region) of the liquid crystal screen, so as to protect a thin film transistor of the liquid crystal screen from static charges generated between the supporting components and the substrate, thereby reducing an occurrence of defections.

The above are merely the preferred embodiments of the present disclosure. A person skilled in the art may make further modifications and improvements without departing from the principle of the present disclosure, and these modifications and improvements shall also fall within the scope of the present disclosure.

What is claimed is:

1. A bearing device, comprising:
   a bearing table configured to bear a substrate; and
   a plurality of supporting components configured to support the substrate, wherein each supporting component is movably arranged on the bearing table, to support the substrate at an adjustable position,
   wherein a guide rail is arranged on the bearing table, and a plurality of sliding blocks capable of moving along the guide rail is arranged on the guide rail, wherein each sliding block is provided with at least one supporting component,
   wherein the bearing table has a first side edge, a second side edge opposite to the first side edge, a third side edge and a fourth side edge opposite to the third side edge, a rollover shaft is arranged at the first side edge and configured to enable the bearing table to be switched from a horizontal posture to a vertical posture, and the guide rail is arranged along an extension direction of the third side edge and the fourth side edge.

2. The bearing device according to claim 1, wherein the guide rail is a bar-like protrusion protruding from a side surface of the bearing table, a groove is arranged in a middle of each sliding block and opened towards the guide rail, and the guide rail is embedded into the sliding block.

3. The bearing device according to claim 2, wherein a plurality of balls is arranged between an inner wall of the groove and a surface of the guide rail and arranged in at least one line in a direction identical to an extension direction of the guide rail.

4. The bearing device according to claim 3, wherein each sliding block comprises a first portion forming a bottom of the groove and a second portion and a third portion forming two side walls of the groove respectively, wherein both the second portion and the third portion are detachably connected to the first portion, and the balls are arranged on a surface of the second portion opposite to the guide rail and a surface of the third portion opposite to the guide rail.

5. The bearing device according to claim 2, wherein a cross section of the groove is of a trapezoidal shape with a size of a bottom of the groove larger than a size of the opening of the groove, and the guide rail is fitted to the groove and has a trapezoidal cross section.

6. The bearing device according to claim 1, further comprising a driving mechanism configured to drive the sliding blocks to move along the guide rail, wherein the driving mechanism comprises:
   cross bars, wherein the supporting components are arranged in an array form, and the sliding blocks corresponding to the supporting components in an identical row are connected to an identical cross bar, to enable the supporting components in the identical row to move simultaneously;
   a driving rail arranged at least one of the third side edge and the fourth side edge of the bearing table, wherein an end of each cross bar is arranged on the driving rail and the cross bar is capable of moving along the driving rail; and
   driving members configured to drive the cross bars to move along the driving rail in a reciprocating manner.

7. The bearing device according to claim 6, wherein each driving member comprises:
   a driving motor comprising an output shaft; and
   a rotatable gear capable of rotating when driven by the output shaft, wherein an end of the cross bar is connected to a center of the rotatable gear, and the rotatable gear is capable of rotating relative to the cross bar;
   wherein the driving rail has a rack engaged with the rotatable gear.

8. The bearing device according to claim 1, wherein a cross section of the bearing table is of a stepwise structure, and a thickness of the bearing table decreases gradually from the first side edge of the bearing table to the second side edge of the bearing table.

9. The bearing device according to claim 1, wherein each supporting component comprises a contact end in contact with the substrate and a connection end at a side of the supporting component far away from the contact end, wherein an end surface of the contact end of the supporting component is a plane having a predetermined area.

10. The bearing device according to claim 9, wherein each supporting component is of a cylindrical structure, and an edge of the contact end is of a chamfered structure acquired through smoothing treatment.

11. The bearing device according to claim 6, wherein an extension direction of each cross bar is perpendicular to an extension direction of the drive rail.

12. The bearing device according to claim 6, wherein an extension direction of each cross bar is perpendicular to an extension direction of the bearing table.

13. An ion implantation device comprising the bearing device according to claim 1.

* * * * *